US012733435B2

(12) United States Patent
Chen et al.

(10) Patent No.: US 12,733,435 B2
(45) Date of Patent: Sep. 8, 2026

(54) REDISTRIBUTION LAYER METALLIC LAYOUT STRUCTURE AND METHOD WITH WARPAGE REDUCTION

(71) Applicant: Taiwan Semiconductor Manufacturing Company, Ltd., Hsin-Chu (TW)

(72) Inventors: Dian-Hau Chen, Hsinchu (TW); Hsiang-Ku Shen, Hsinchu City (TW); Yu-Hsiung Wang, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 501 days.

(21) Appl. No.: 18/326,649

(22) Filed: May 31, 2023

(65) Prior Publication Data

US 2024/0404853 A1 Dec. 5, 2024

(51) Int. Cl.
*H10P 72/00* (2026.01)
*H10P 74/20* (2026.01)
(Continued)

(52) U.S. Cl.
CPC ........ *H10P 72/0616* (2026.01); *H10P 74/203* (2026.01); *H10P 76/2041* (2026.01); *H10P 76/4085* (2026.01); *H10W 74/114* (2026.01); *H10W 90/701* (2026.01); *H10W 72/01304* (2026.01); *H10W 72/01353* (2026.01);
(Continued)

(58) Field of Classification Search
CPC ........... H01L 21/67288; H01L 21/0274; H01L 21/0337; H01L 22/12; H01L 23/3121; H01L 23/49811; H01L 24/27; H01L 24/32; H01L 2224/27005; H01L 2224/27622; H01L 2224/27831; H01L 2224/32013; H01L 2224/32227; H01L 2924/1306; H01L 2924/1811; H10P 72/0616; H10P 74/203; H10P 76/2041; H10P 76/4085; H10W 74/114; H10W 90/701; H10W 72/01304; H10W 72/01353; H10W 72/01355;
(Continued)

(56) References Cited

U.S. PATENT DOCUMENTS

| | | | |
|---|---|---|---|
| 8,802,504 | B1 | 8/2014 | Hou et al. |
| 8,803,292 | B2 | 8/2014 | Chen et al. |

(Continued)

FOREIGN PATENT DOCUMENTS

| | | |
|---|---|---|
| TW | 202036809 | 10/2020 |
| TW | 202046416 | 12/2020 |

(Continued)

*Primary Examiner* — Nha T Nguyen
(74) *Attorney, Agent, or Firm* — HAYNES AND BOONE, LLP

(57) ABSTRACT

The present disclosure provides a method according to some embodiments. The method includes receiving an integrated circuit (IC) layout of a semiconductor structure that includes a redistribution layout (RDL) structure having a plurality of RDL metallic features; modifying the IC layout such that the modified RDL structure meets a criterion associated with a X-Y ratio gap; generating a tape-out according to the modified IC layout; and fabricating the semiconductor structure according to the modified IC layout defined in the tape-out.

20 Claims, 27 Drawing Sheets

(51) Int. Cl.

| | |
|---|---|
| ***H10P 76/20*** | (2026.01) |
| ***H10P 76/40*** | (2026.01) |
| ***H10W 74/10*** | (2026.01) |
| ***H10W 90/00*** | (2026.01) |
| *H10W 72/00* | (2026.01) |
| *H10W 72/30* | (2026.01) |
| *H10W 74/00* | (2026.01) |

(52) U.S. Cl.
CPC ............................ *H10W 72/01355* (2026.01); *H10W 72/07352* (2026.01); *H10W 72/321* (2026.01); *H10W 74/00* (2026.01); *H10W 90/734* (2026.01)

(58) Field of Classification Search
CPC ......... H10W 72/07352; H10W 72/321; H10W 74/00; H10W 90/734
See application file for complete search history.

(56) References Cited

U.S. PATENT DOCUMENTS

| | | | | |
|---|---|---|---|---|
| 8,803,316 | B2 | 8/2014 | Lin et al. | |
| 8,993,380 | B2 | 3/2015 | Hou et al. | |
| 9,281,254 | B2 | 3/2016 | Yu et al. | |
| 9,299,649 | B2 | 3/2016 | Chiu et al. | |
| 9,372,206 | B2 | 6/2016 | Wu et al. | |
| 9,425,126 | B2 | 8/2016 | Kuo et al. | |
| 9,443,783 | B2 | 9/2016 | Lin et al. | |
| 9,496,189 | B2 | 11/2016 | Yu et al. | |
| 10,325,839 | B2 * | 6/2019 | Aoki | H01L 23/49827 |
| 11,887,862 | B2 * | 1/2024 | Bishop | H01L 23/49838 |
| 12,494,422 | B2 * | 12/2025 | Chiu | H01L 24/05 |
| 2011/0249111 | A1 * | 10/2011 | Weiss | H01L 22/20<br>257/E21.525 |
| 2016/0056055 | A1 * | 2/2016 | Ko | H01L 21/4857<br>438/126 |
| 2016/0064344 | A1 * | 3/2016 | Yajima | H01L 24/45<br>438/653 |
| 2016/0141262 | A1 * | 5/2016 | Hu | H01L 21/6835<br>257/738 |
| 2017/0062361 | A1 * | 3/2017 | Yajima | H01L 24/49 |
| 2019/0109086 | A1 * | 4/2019 | Li | H01L 23/585 |
| 2020/0098707 | A1 * | 3/2020 | Chen | H01L 23/53228 |
| 2020/0219845 | A1 * | 7/2020 | Liu | H01L 23/3121 |
| 2020/0373243 | A1 * | 11/2020 | Jang | H01L 24/19 |
| 2021/0100103 | A1 * | 4/2021 | Chung | G06F 9/30189 |
| 2021/0143091 | A1 | 5/2021 | Yang | |
| 2022/0059492 | A1 * | 2/2022 | Yoon | H01L 24/24 |

FOREIGN PATENT DOCUMENTS

| | | |
|---|---|---|
| TW | 202137449 | 10/2021 |
| TW | 202318608 | 5/2023 |

* cited by examiner

REDISTRIBUTION LAYER METALLIC LAYOUT STRUCTURE AND METHOD WITH WARPAGE REDUCTION

BACKGROUND

In semiconductor industry, integrated circuits (ICs) are formed on a semiconductor substrate and are saw to IC chips. Each IC chip is further attached (such as by bonding) to a circuit board, such as a printed circuit board in electric products. In existing technologies, bond pads of the chip are connected to the circuit board through wire bonding. In advanced technologies, a circuit chip is flipped and directly bonded to the circuit board for reduced cost. In this technology, a redistribution layer of conductive metal lines is formed on the chip to reroute bond connections from the edge to the center of the chip. The existing structure of the redistribution layer and the corresponding method introduce various issues, such as substrate warpage due to stress, which further causes passivation defect, circuit reliability concern and other issues. Therefore, the present disclosure provides a redistribution layer structure and a method making the same to address the above issues.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1A:
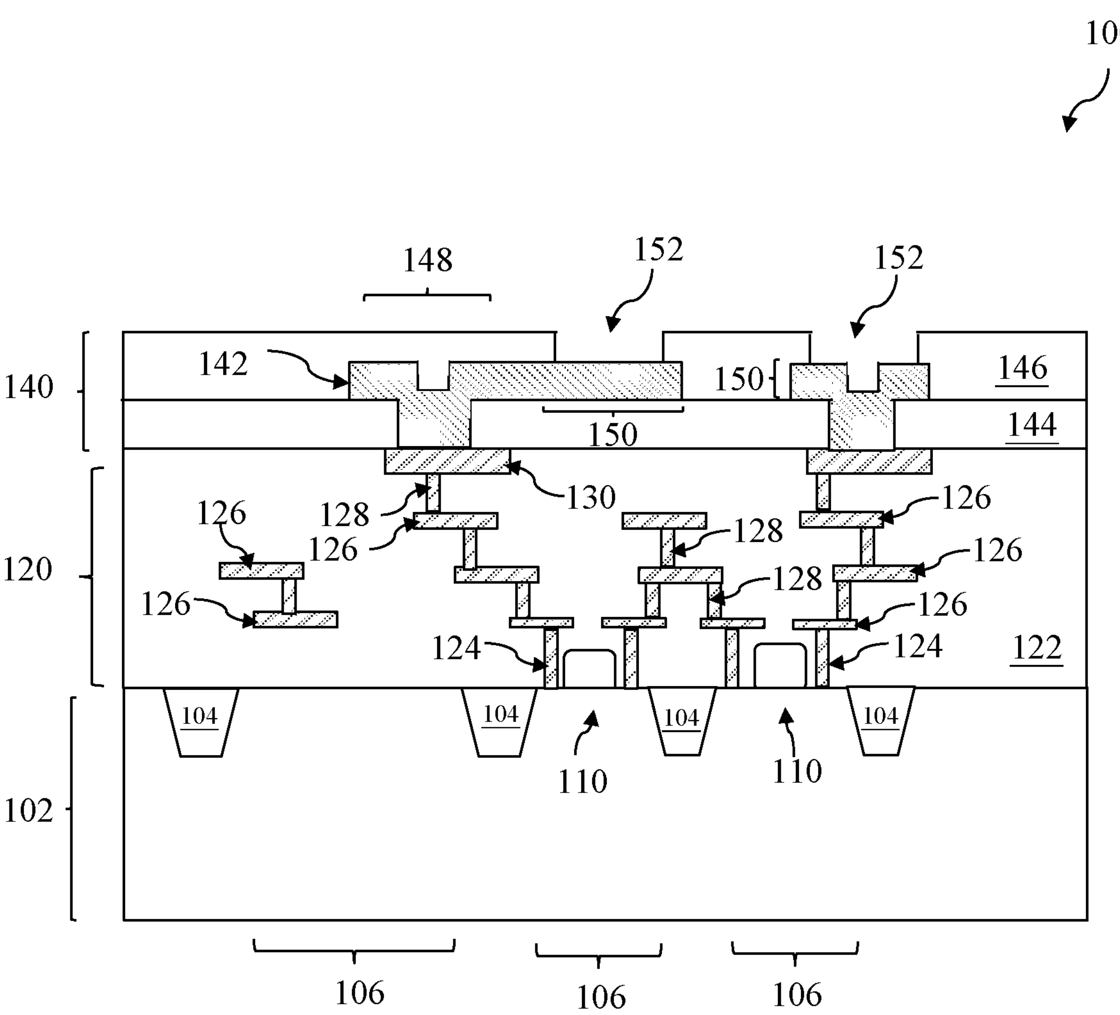
FIG. 1A is a sectional view of a semiconductor device structure having a redistribution layer (RDL) structure constructed according to various aspects of the present disclosure in some embodiments.

The following disclosure provides many different embodiments, or examples, for implementing different features. Reference numerals and/or letters may be repeated in the various examples described herein. This repetition is for the purpose of simplicity and clarity and does not in itself dictate a relationship between the various disclosed embodiments and/or configurations. Further, specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. Moreover, the formation of a feature on, connected to, and/or coupled to another feature in the present disclosure may include embodiments in which the features are formed in direct contact, and may also include embodiments in which additional features may be formed interposing the features, such that the features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one feature relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described, or other values as understood by person skilled in the art. For example, the term "about 5 nm" encompasses the dimension range from 4.5 nm to 5.5 nm.

Figure 1B:
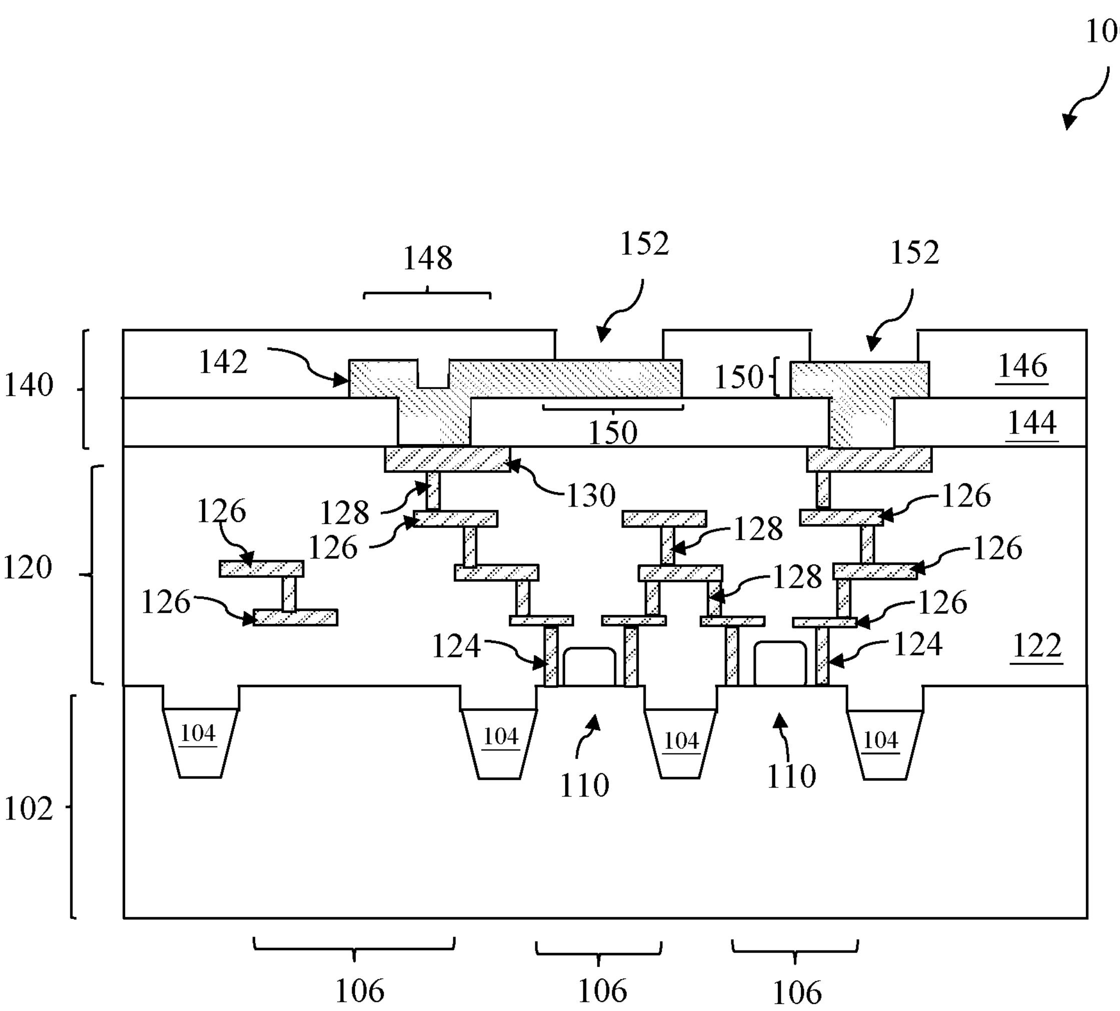
FIG. 1B is a sectional view of a semiconductor device structure having RDL structure and fin active regions constructed according to various aspects of the present disclosure in some other embodiments.
Figure 1C:
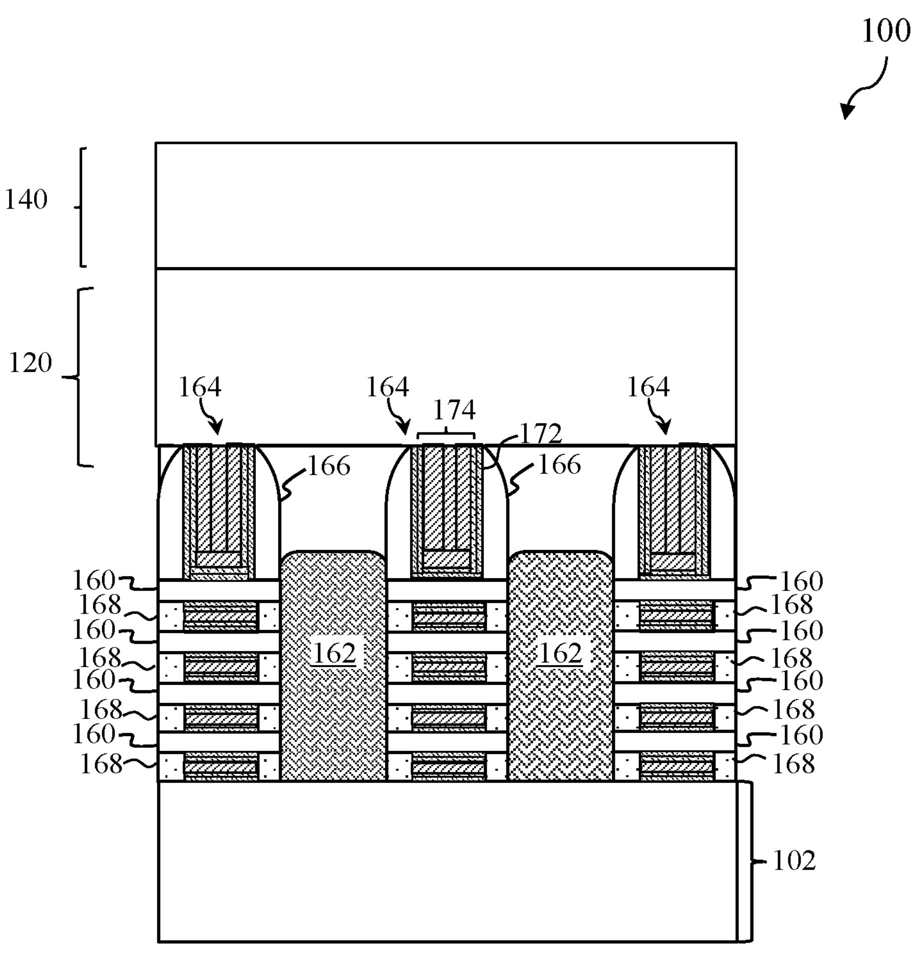
FIG. 1C is a sectional view of a semiconductor device structure having RDL structure and field-effect transistors of multiple channels vertically stacked on a substrate, constructed according to various aspects of the present disclosure in some other embodiments.

FIG. 1A is a sectional view of an integrated circuit (IC) structure (or semiconductor structure, or a work piece) 100 constructed according to various aspects of the present disclosure in one embodiment. FIG. 1B is a sectional view of the semiconductor structure 100 with fin active regions constructed according to other embodiments. FIG. 1C is a sectional view of the semiconductor structure 100 with multiple channels vertically stacked constructed according to other embodiments. FIG. 2 is a flowchart of a method 200 making the semiconductor structure 100 in accordance with some embodiments. The semiconductor structure 100 and the method 200 making the same are collectively described with reference to FIGS. 1A, 1B, 1C, and other figures. In some embodiments, the semiconductor structure 100 includes flat active regions with various IC devices, such as plain field-effect transistors (FETs), formed thereon, as illustrated in FIG. 1A. In some embodiments, the semiconductor structure 100 includes fin active regions with various IC devices formed thereon, as illustrated in FIG. 1B. In some embodiments, the semiconductor structure 100 includes field-effect transistor structure having multiple channels vertically stacked, as illustrated in FIG. 1C.

The semiconductor structure 100 includes a substrate 102. The substrate 102 includes a bulk silicon substrate. Alternatively, the substrate 102 may include an elementary semiconductor, such as silicon or germanium in a crystalline structure; a compound semiconductor, such as silicon germanium, silicon carbide, gallium arsenic, gallium phosphide, indium phosphide, indium arsenide, and/or indium antimonide; or combinations thereof. Possible substrates 102 also include a silicon-on-insulator (SOI) substrate. SOI substrates are fabricated using separation by implantation of oxygen (SIMOX), wafer bonding, and/or other suitable methods.

The substrate 102 also includes various isolation features, such as isolation features 104 formed on the substrate 102 and defining various active regions on the substrate 102, such as an active region 106. The isolation feature 104 utilizes isolation technology, such as shallow trench isolation (STI), to define and electrically isolate the various active regions. The isolation feature 104 includes silicon oxide, silicon nitride, silicon oxynitride, other suitable dielectric materials, or combinations thereof. The isolation feature 104 is formed by any suitable process. As one example, forming STI features includes a lithography process to expose a portion of the substrate, etching a trench in the exposed portion of the substrate (for example, by using a dry etching and/or wet etching), filling the trench (for example, by using a chemical vapor deposition process) with one or more dielectric materials, and planarizing the substrate and removing excessive portions of the dielectric material(s) by a polishing process, such as a chemical mechanical polishing (CMP) process. In some examples, the filled trench may have a multi-layer structure, such as a thermal oxide liner layer and filling layer(s) of silicon nitride or silicon oxide.

The active region 106 is a region with semiconductor surface wherein various doped features are formed and configured to one or more device, such as a diode, a transistor, and/or other suitable devices. The active region may include a semiconductor material similar to that (such as silicon) of the bulk semiconductor material of the substrate 102 or different semiconductor material, such as silicon germanium (SiGe), silicon carbide (SiC), or multiple semiconductor material layers (such as alternative silicon and silicon germanium layers) formed on the substrate 102 by epitaxial growth, for performance enhancement, such as strain effect to increase carrier mobility.

In some embodiments illustrated in FIG. 1B, the active region 106 is three-dimensional, such as a fin active region extended above the isolation feature 104. The fin active region is extruded from the substrate 102 and has a three-dimensional profile for more effective coupling between the channel region (or simply referred to as channel) and the gate electrode of a field effect transistors (FET). The fin active region 106 may be formed by selective etching to recess the isolation features 104, or selective epitaxial growth to grow active regions with a semiconductor same or different from that of the substrate 102, or a combination thereof.

The semiconductor substrate 102 further includes various doped features, such as n-type doped wells, p-type doped wells, source and drain, other doped features, or a combination thereof configured to form various devices or components of the devices. The semiconductor structure 100 includes various IC devices 110 formed on the semiconductor substrate 102. The IC devices includes fin field-effect transistors (FinFETs), diodes, bipolar transistors, imaging sensors, resistors, capacitors, inductors, memory cells, or a combination thereof. In FIG. 1A (or FIG. 1B), FETs are provided only for illustration.

In some embodiments illustrated in FIG. 1C, the semiconductor structure 100 includes one or more FET with multi-bridge-channel (MBC). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor having a plurality of channel members vertically stacked. FIG. 1C only illustrate the semiconductor structure 100 in part, especially the substrate 102 and an MBC device formed thereon. The interconnect structure 120 and the redistribution layer (RDL) structure 140 including the bond pad structure are similar to those in FIGS. 1A and 1B, which will be described later in detail. Particularly, the semiconductor structure 100 includes a FET having multiple channels 160 vertically stacked over the substrate 102. The FET further includes source/drain (S/D) features 162 disposed on opposite edges of the channels 160 and connected to the channels 160. The FET further includes a gate stack 164 interposed between the S/D features 162 and extended to wrap around each of the multiple channels 160 vertically stacked. The FET may further include gate spacers 166 disposed on sidewalls of the gate stack 164 and inner spacers 168 disposed between the gate stack 164 and the S/D features 162 to provide isolation. The gate spacers 166 and inner spacers may include one or more dielectric materials, such as silicon oxide, silicon nitride, silicon oxynitride, other suitable dielectric material or a combination thereof. The gate stack 164 includes a gate dielectric layer 172 and a gate electrode 174 on the gate dielectric layer 172.

In some other embodiments, the semiconductor structure 100 includes one or complimentary FETs (CFETs) wherein each pair of a p-type FET and an n-type FET are vertically stacked.

Still referring to FIG. 1A, the semiconductor structure 100 further includes an interconnect structure formed on the semiconductor substrate 102. The interconnect structure includes various conductive features to couple various IC devices into an integrated circuit. The interconnect structure further includes an interlayer dielectric (ILD) layer 122 to separate and isolate various conductive features. For examples, the interconnect structure includes contacts 124; metal lines 126; and vias 128. The metal lines 126 are distributed in multiple metal layers, such as a first metal layer, a second metal layer over the first metal layer, . . . and the top metal layer. In FIG. 1A, four metal layers are illustrated. The top metal lines are separately labeled with numerical 130. The contacts 124 provide vertical electrical routing from the semiconductor substrate 102 to the metal lines. The vias 128 provide vertical electrical routing between adjacent metal layers. Various conductive features are formed by one or more conductive material, such as metal, metal alloy, or silicide. For examples, the metal lines 126 may include copper, aluminum copper alloy, other suitable conductive material, or a combination thereof. The vias 128 may include copper, aluminum copper alloy, other suitable conductive material, or a combination thereof. The contacts 124 may include tungsten, silicide, nickel, cobalt, copper, ruthenium, other suitable conductive material, or a combination thereof. In some examples, various conductive features may further include a barrier layer, such as tantalum and tantalum nitride, titanium and titanium nitride. In the present embodiment, the top metal lines 130 include copper.

The ILD layer 122 includes one or more dielectric material to provide isolation functions to various device components (such as gates) and various conductive features (such as metal lines, contacts and vias). The ILD layer 122 includes a dielectric material, such as silicon oxide, a low-k dielectric material, other suitable dielectric material, or a combination thereof. In some examples, the low-k dielectric material includes fluorinated silica glass (FSG), carbon doped silicon oxide, Xerogel, Aerogel, amorphous fluorinated carbon, Parylene, BCB (bis-benzocyclobutenes), polyimide, and/or other suitable dielectric materials with dielectric constant substantially less than that of the thermal silicon oxide. The formation of the ILD layer 122 includes deposition and CMP, for examples. The deposition may include spin-on coating, CVD, other suitable deposition technology or a combination thereof. The ILD layer 122 may include multiple layers and is collectively formed with various conductive features in a proper procedure, such as damascene process.

In some embodiments, the interconnect structure, or a portion thereof, is formed by deposition and patterning. For examples, a metal (or metal alloy), such as aluminum copper is deposited by physical vapor deposition (PVD), then is patterned by lithography process and etching. Then an ILD layer is disposed on by deposition (and CMP). In some embodiments, the interconnect structure 120 uses a damascene process to form metal lines. In a damascene process, an ILD layer is deposited, may be further planarized by CMP, and then is patterned by lithography and etching to form trenches. One or more conductive material is deposited to fill the trenches, and another CMP process is applied to remove the excessive conductive material and planarize the top surface, thereby forming conductive features. The damascene process may be used to form metal lines, vias, and contacts. A dual damascene process may be applied to form one layer of metal lines and vias adjacent the metal lines. In this case, the ILD layer is deposited and patterned twice to form trenches and via holes, respectively. Then the metal is deposited to fill both the trenches and via holes to form metal lines and vias.

The semiconductor structure 100 further includes a redistribution layer (RDL) structure 140 disposed on the interconnect structure to redistribute bond pads, such as from the edge to the center of an IC chip for flip chip bonding or other suitable packaging technology to integrate an IC chip to a board (e.g., a printed circuit board).

The RDL structure 140 includes passivation and RDL metallic features 142 embedded in the passivation. Especially, the RDL metallic features include portions extending within the openings 152 of the passivation, and those portions function as, therefore also referred to as, bond pads 150. In various embodiments, the RDL conductive features (or the RDL metallic features) 142 of the RDL structure 140 are metal lines distributed in one or more metal layer. The RDL metallic features are different from the metal lines in the interconnect structure 120. For example, the RDL metallic features 142 are embedded in the passivation and function redistribution and bond pads.

In the present embodiment, the passivation includes a first passivation layer 144 and a second passivation layer 146 disposed on the first passivation layer 144. The first passivation layer 144 includes a redistribution via (RV) hole aligned to a top metal line 130 so that the portion 148 of a RDL metallic feature 142 is formed in the RV hole and directly contact the top metal line 130. The portion 148 of the RDL metallic feature 142 in the redistribution via is also referred to as RV 148. The RDL metallic feature 142 vertically extends from the first passivation layer 144 to the second passivation layer 146 and horizontally extends from the RV 148 to the opening 152 for bond pad redistribution. The portion of the RDL metallic feature 142 exposed within the opening 152 is also referred to as bond pad 150.

In the present embodiment, the first passivation layer 144 includes a silicon nitride (SiN) layer and an un-doped silica glass (USG) layer on the SiN layer; and the second passivation layer 146 includes an USG layer and a SiN layer disposed on the USG layer. In the present embodiment, the RDL metallic features 142 include a barrier layer, a diffusion layer disposed on the barrier layer and an aluminum copper alloy layer disposed on the diffusion layer. The barrier layer may further include a tantalum film and a tantalum nitride film disposed on the tantalum film. The diffusion layer is a metal oxide. In the present embodiment, the diffusion layer includes tantalum, oxygen, aluminum, and nitrogen. The RDL structure 140, especially the RDL metallic features 142, is further described in the following descriptions.

The RDL metallic features 142 of the RDL structure 140 are designed with a proper layout to achieve the intended purposes, which includes redistributing the bond pads 150. However, the RDL metallic features 142 have relative larger dimensions relative to the metal lines in the interconnect structure 120. In some examples, the RDL metallic features 142 are lines with width ranging between 1.5 μm and 30 μm. The RDL metallic features 142 have a thermal expansion coefficient different from that of the passivation materials. This may introduce thermal stress and lead to the deformation of the substrate, such as warpage. In the described embodiment, the semiconductor structure is a chip with proper dimensions. The semiconductor structure is formed on a semiconductor wafer and is then diced into chips.

Figure 2A:
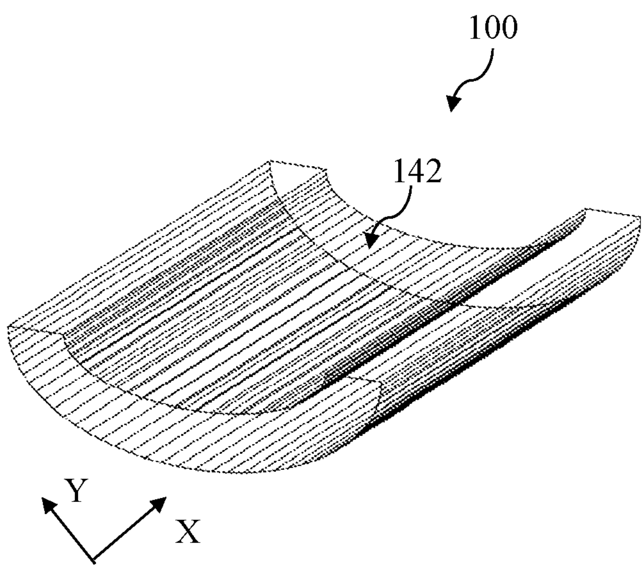
FIG. 2A is a perspective view of the semiconductor structure constructed according to various aspects of the present disclosure in some other embodiments.

FIG. 2A is a perspective view of the semiconductor structure 100 in portion constructed according to some examples. Particularly, only RDL metallic features 142 are illustrated in FIG. 2A. When the RDL metallic features 142 on the substrate are dominantly oriented along one direction, such as X direction, the stress from the RDL metallic features 142 may cause the substrate to bend along Y direction, resulting in quality and reliability issues. The present disclosure provides a structure of the RDL metallic features 142 and a method making the same. Especially the structure of the RDL metallic features 142 includes a layout of the RDL metallic features 142 constructed to reduce the stress-reduced deformation.

Figure 2B:
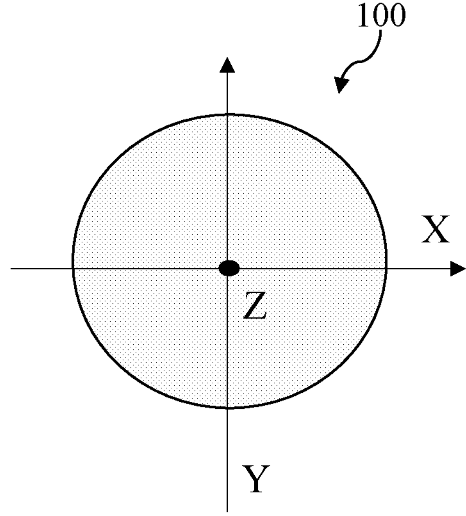
FIG. 2B is a top view of the semiconductor structure constructed according to various aspects of the present disclosure in some other embodiments.

As illustrated in FIG. 2B, the surface of a substrate spans along two orthogonal directions (X and Y directions) with a normal direction of the surface along Z direction, wherein X, Y and Z directions constitute a Cartesian coordinate system. It is found through experiments and theoretical analysis that warpage is not only determined by the magnitude of the stress but the distribution of the stress, especially the orientation of the stress. More specifically, it is found that the layout of the RDL structure 140 including duty ratio and spacing of the RDL metallic features 142 are major factors to contribute to the substrate deformation. According to the present disclosure, the RDL metallic features 142 of the RDL structure 140 are modified by various means including dummy insertion and adjusting the RDL metallic features to achieve a layout of the RDL structure 140 with minimized or eliminated deformation. The method is described in detail.

Figure 4:
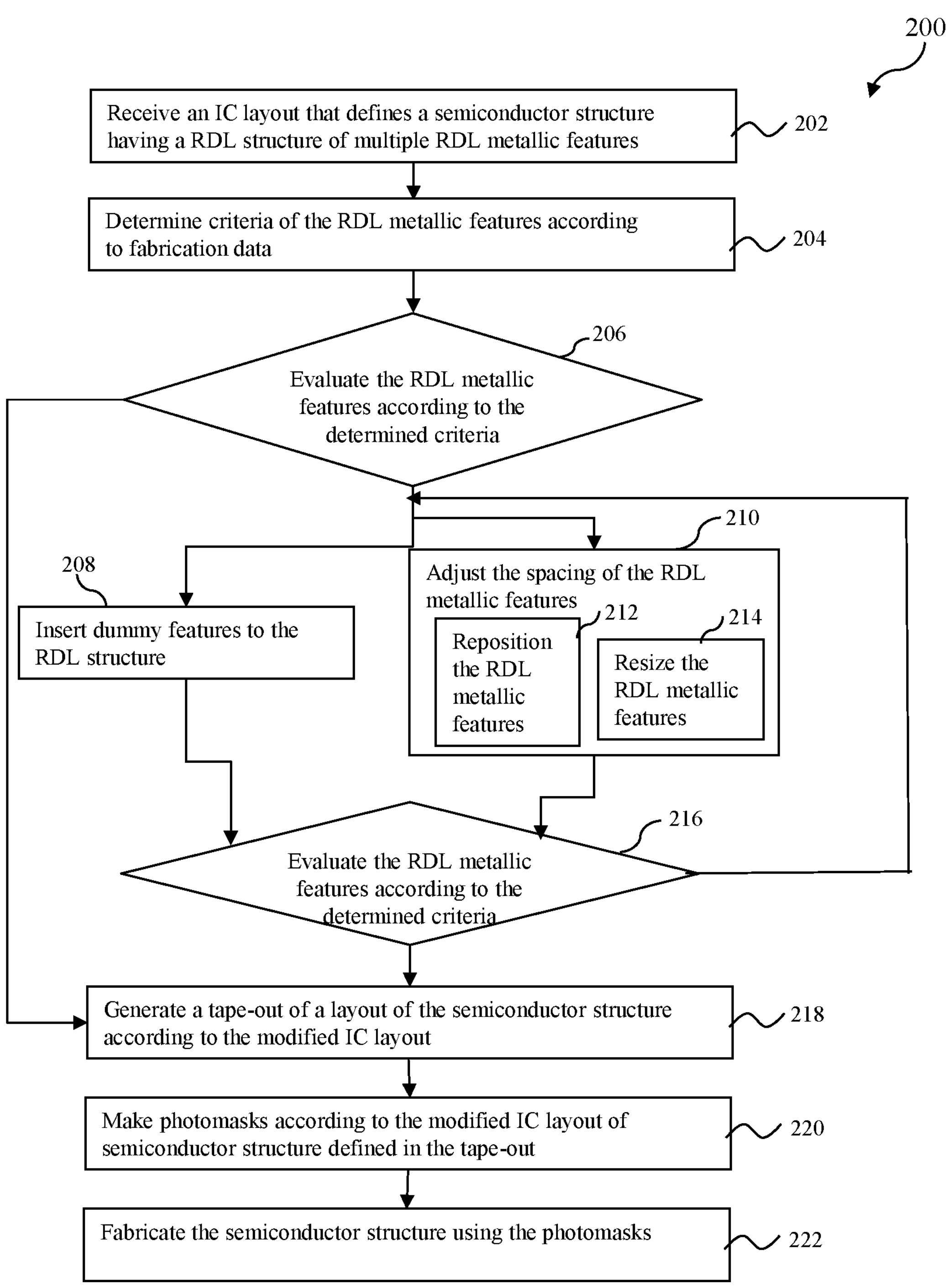
FIG. 4 is a flowchart of a method to fabricate an integrated circuit (IC) structure of FIG. 1 in accordance with some embodiments.

FIG. 4 is a flowchart of a method 200 constructed according to some embodiments. The method 200 begins with an operation 202 by receiving an IC layout that defines a semiconductor structure, such as a semiconductor structure 100 in FIG. 1A, 1B or 1C. Particularly, the IC layout of the semiconductor structure includes a layout of the RDL structure 140 having multiple RDL metallic features 142. The RDL metallic features 142 are conductive lines with width ranging between 1.5 μm and 30 μm according to some embodiments. The RDL metallic features 142 include first conductive features 142X longitudinally oriented along X direction and second conductive features 142Y longitudinally oriented along Y direction. In the disclosed example of the IC layout, the first conductive features 142X and the second conductive features 142Y are not balanced. This can be evaluated by an X-Y ratio gap. The X-Y ratio gap is defined as the relative difference between the X duty ratio and Y duty ratio. Furthermore, the X duty ratio is defined as the total area of the first conductive features 142X in the substrate over the area of the substrate, and the Y duty ratio is defined the total area of the second conductive features 142Y over the area of the substrate. When the X-Y ratio gap is great, the RDL metallic features 142 are not balanced and have the concern of the deformation, such as warpage. The X-Y ratio gap may be negative or positive. Generally, the X-Y ratio gap usually is greater than −1 and less than 1, or ranges between −1 and 1.

The method 200 proceeds to an operation 204 by determining criteria of the RDL metallic features according to manufacturing data (or fabrication data). The criteria of the RDL metallic features 142 are one or more values used to evaluate the RDL structure 140 if there is a stress-induced deformation. When the RDL metallic features 142 of the RDL structure 140 are beyond the criteria, the RDL structure 140 needs to be modified to eliminate or minimize the deformation. The criteria should be determined according to the fabrication data collected from the IC manufacture (or simply IC fab). The fabrication data are associated with similar products since different products may have different criteria. In the disclosed embodiments based on the experiments and theoretical analysis, two rules are used as the criteria. Specifically, the criteria include a first criterion associated with the X-Y ratio gap and a second criterion associated with the spacing, which are further described. The X-Y ratio gap is defined above. The spacing is defined as the spacing dimension among parallel RDL metallic features 142. In some embodiments, the spacing is defined as the average spacing $S_x$ among the first conductive features 142X if they are dominant. In some embodiments, the spacing is defined as the average spacing $S_y$ among the second conductive features 142Y if they are dominant. In some embodiments, the spacing is defined as the average of $S_x$ and $S_y$.

Figure 2C:
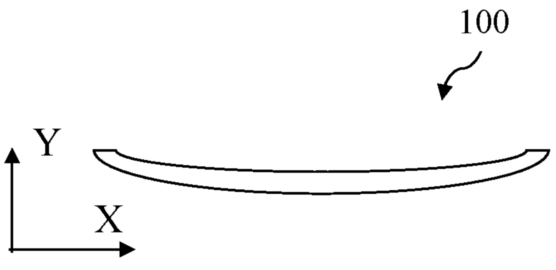
FIGS. 2C, 2D, 2E and 2F are sectional views of the semiconductor structure constructed according to various aspects of the present disclosure in some other embodiments.
Figure 2D:
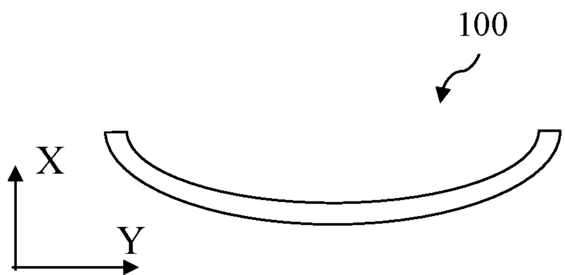
Figure 2E:
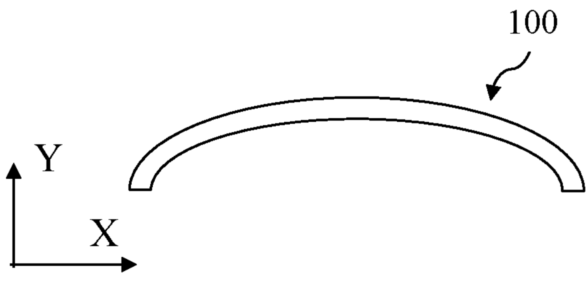
Figure 2F:
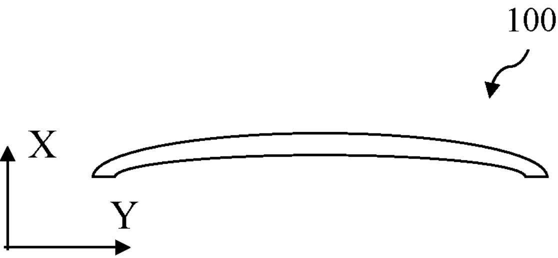

The first criterion is a positive number associated with the X-Y ratio gap and is less than 1. In some embodiments, the first criterion is 30%. If the absolute value of the X-Y ratio gap is greater than 30%, the RDL structure 140 needs to be modified. Especially, the X-Y ratio gap can be positive or negative. If the X duty ratio is greater than the Y duty ratio, the X-Y ratio gap is positive. If the X duty ratio is less than the Y duty ratio, the X-Y ratio gap is negative. When the X-Y ratio gap is positive, the semiconductor structure has a substantial warpage along Y direction as illustrated in FIG. 2D but much less warpage along X direction as illustrated in FIG. 2C. When the X-Y ratio gap is negative, the semiconductor structure has a substantial warpage along X direction as illustrated in FIG. 2E but much less warpage along Y direction as illustrated in FIG. 2F.

In some embodiments, the second criterion is that the spacing is 3 μm. If the spacing is greater than 3 μm, there is warpage issue and the RDL structure 140 needs to be modified. In some embodiments, the criteria may be different, depending on the products and the manufacturing data.

Figure 3A:
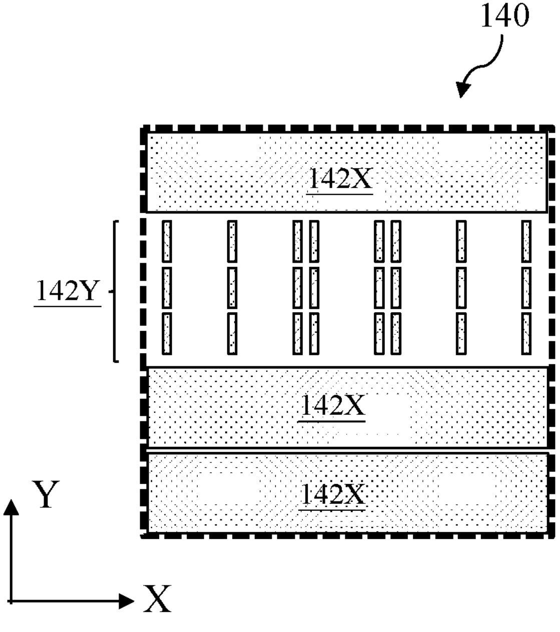
FIGS. 3A, 3B, 3C and 3D are sectional views of the semiconductor structure constructed according to various aspects of the present disclosure in some other embodiments.

The method 200 proceeds to an operation 206 by evaluating the RDL structure 140, particularly the RDL metallic features 142 of the RDL structure 140, according to the determined criteria. In the disclosed embodiment, if both first and second criteria, or any one of them, are not met, the RDL structure fails the criteria. If both two criteria are met, the RDL structure 140 passes the criteria. If the RDL structure passes the criteria, the method 200 proceeds to an operation 218. If the RDL structure fails the criteria, the method 200 proceeds to an operation 208 or 210. Furthermore, the operations 208 and 210 may be implemented in parallel, in series, or alternatively either one of them. In some embodiments as illustrated in FIG. 3A, the RDL metallic features 142 are dominantly oriented along X direction. The X duty ratio is about 50% and Y duty ratio is about 4.8%. Accordingly, the X-Y ratio gap is evaluated as about 45.2%, which is greater than 30%.

Figure 3B:
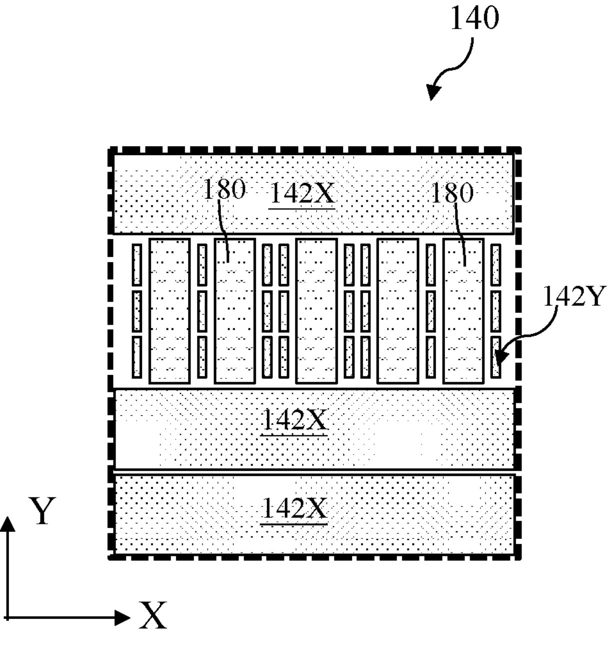

The operation 208 includes inserting dummy features to the RDL structure 140. The dummy features are similar to the RDL metallic features 142 in terms of composition and formation but are not intended to be connected for circuit routing and are added to adjust the duty ratios so that the X-Y ratio gap is reduced. Specifically, each of the dummy features is isolated from other conductive features. In some embodiments as illustrated in FIG. 3A, the X-Y ratio gap of the RDL metallic features 142 is greater than 30% (as described above) and are dominantly oriented along X direction, the dummy features are added to increase the Y duty ratio to generate a modified RDL structure 140 as illustrated in FIG. 3B. In furtherance of the embodiments, the dummy features 180 are longitudinally oriented along Y direction. After the insertion of the dummy features 180, the X-Y ratio gap is less than 30%, such as about 27.2%.

Particularly, the X-Y ratio gap could be positive or negative, as described in FIGS. 2C-2F. If the X-Y ratio gap is positive, it indicates that the X duty ratio is greater than the Y duty ratio, dummy features 180 are longitudinally oriented along Y direction to increase the Y duty ratio and reduce the absolute value of the X-Y ratio gap. If the X-Y ratio gap is negative, it indicates that the X duty ratio is less than the Y duty ratio, dummy features 180 are longitudinally oriented along X direction to increase the X duty ratio and reduce absolute value of the X-Y ratio gap.

The operation 208 for dummy insertion may be ruled-based or alternatively model-based. For example, in the rule-based approach includes inserting dummy features with predetermined dimensions and proper locations. In another example, the model-based approach includes inserting dummy features with location, shape and dimensions according to a simulation model such that the X-Y ratio gap is effectively reduced.

The operation 210 is different from the operation 208 and includes adjusting instead of adding. The adjusting the RDL metallic features 142 of the RDL structure 140. in the operation 210 may be implemented various ways, which include a suboperation 212 by repositioning the RDL metallic features 142, a suboperation 214 by resizing the RDL metallic features 142, and other suitable suboperations, such as reshaping the RDL metallic features 142. In the suboperation 212, repositioning the RDL metallic features 142 includes changing the location of one or more RDL metallic features 142 so that the spacing is adjusted. In the suboperation 214, resizing the RDL metallic features 142 includes changing dimensions of one or more RDL metallic features 142 so that the spacing is adjusted. For example, the first conductive features 142X longitudinally oriented along X direction, or a subset thereof, are resized such that the corresponding widths are decreased so that the spacing is increased.

The operations 208 and 210 are not independent but are related with each other. For example, inserting dummy features by the operation 208 also impacts the spacing, such as reducing the spacing. In another example, adjusting the RDL metallic features 142 by the operation 210 also impacts the X-Y ratio gap.

Figure 3C:
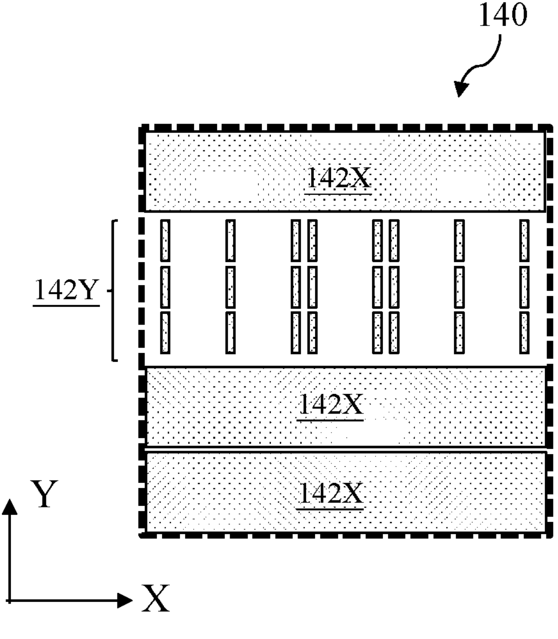
Figure 3D:
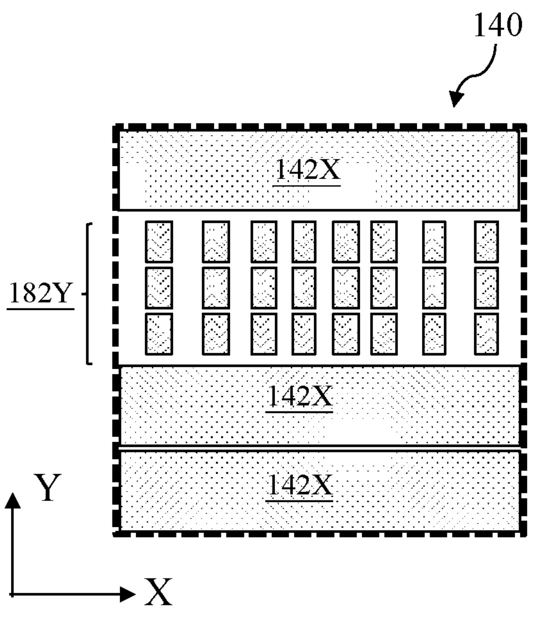

As described above, the adjustment of the RDL metallic features 142 in the operation 210 may include one or more suboperations that may be implemented in series, in parallel or alternatively only one or a subset of those suboperations. In some embodiments, the spacing of the RDL metallic features 142 is greater than the predetermined value, such as 3 μm. Especially, the second conductive features 142Y have an average spacing greater than 3 μm, such as illustrated the RDL structure illustrated in FIG. 3C. In the illustrated embodiment in FIG. 3C, the second conductive features 142Y are resized with increased width, and additionally repositioned to generate a modified RDL structure 140 illustrated in FIG. 3D. Accordingly, the spacing of the RDL structure 140 is reduced below the predetermined value, such as 3 μm.

After the operations 208 and 210 or a subset thereof, the method 200 proceeds to an operation 216 by evaluating the modified RDL structure 140 according to the predetermined criteria. If the modified RDL structure 140 fails the predetermined criteria, such as both first and second criteria, the method 200 returns back to the operations 208 and 210. The operations 208 and 210 may be implemented multiple cycles until the modified RDL structure 140 passes the predetermined criteria. If the modified RDL structure 140 passes the predetermined criteria, such as both first and second criteria, the method 200 proceeds to the operation 218.

The operation 218 generates a tape-out for mask making according to thus modified IC design layout, which includes the modified RDL structure 140, which further includes the RDL metallic features 142, modified RDL metallic features (such as 182Y) and the dummy features 180 or a subset thereof. The tape-out defines the modified IC design to be formed on photomasks for wafer fabrication or to be directly transferred to semiconductor wafers by direct writing techniques, such as electron-beam direct writing. The tape-out of the modified IC design includes various pattern layers (such as a layer of active regions, a layer of gate stacks and so on) and spatial relationships among those pattern layers, especially various shapes and sizes of various pattern features in each pattern layer. In the present disclosure, the modified IC layout defined in the tape-out includes the modified RDL structure 140 of the semiconductor structure 100.

In some embodiments, the method 200 further includes an operation 220 making photomasks according to the tape-out that defines the modified IC layout of the semiconductor structure 100 having the modified RDL structure 140.

In some embodiments, the method 200 further includes an operation 222 to fabricate the semiconductor structure 100 having the modified RDL structure 140 using the above photomasks. Especially, the operation 222 includes fabricating the RDL structure 140 using the photomask(s) that defines the modified RDL structure 140. The method 200 to fabricate the semiconductor structure 100 having the modified RDL structure 140 is further described below according to some embodiments.

Figure 5A:
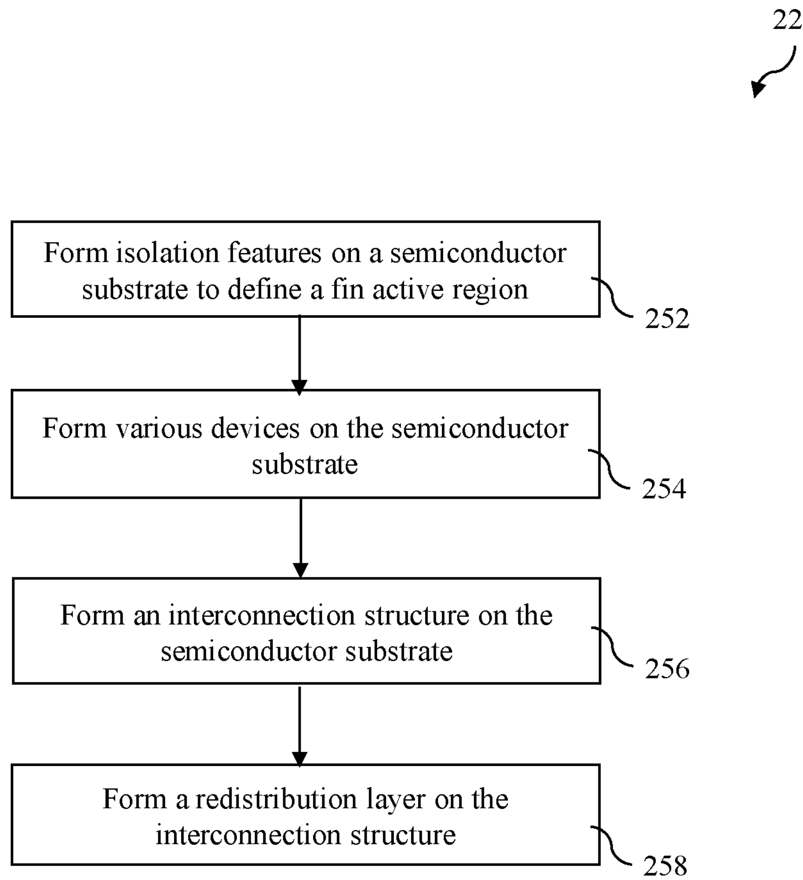
FIGS. 5A, 5B and 5C are flowcharts of a method to fabricate an integrated circuit (IC) structure in accordance with some embodiments.

FIG. 5A is a flowchart of a method 222 making the semiconductor structure 100 in accordance with some embodiments. Some fabrication details are provided above and are not repeated here. The method 222 includes an operation 252 to form isolation features 104 on the semiconductor substrate 102; an operation 254 to form various IC devices (such as FETs, FinFETs, CFETs, diodes, passive devices, imaging sensors, memory cells, other suitable IC devices or a combination thereof) on the semiconductor substrate 102; an operation 256 to form an interconnect structure (such as contacts 124, metal lines 126, vias 128 and top metal lines 130) by a suitable method, such as damascene process; and an operation 258 to form a RDL structure 140. The method 222 may include other operations before, during or after the above operations. The method to form the RDL structure 140 is further described in detail below.

Figure 5B:
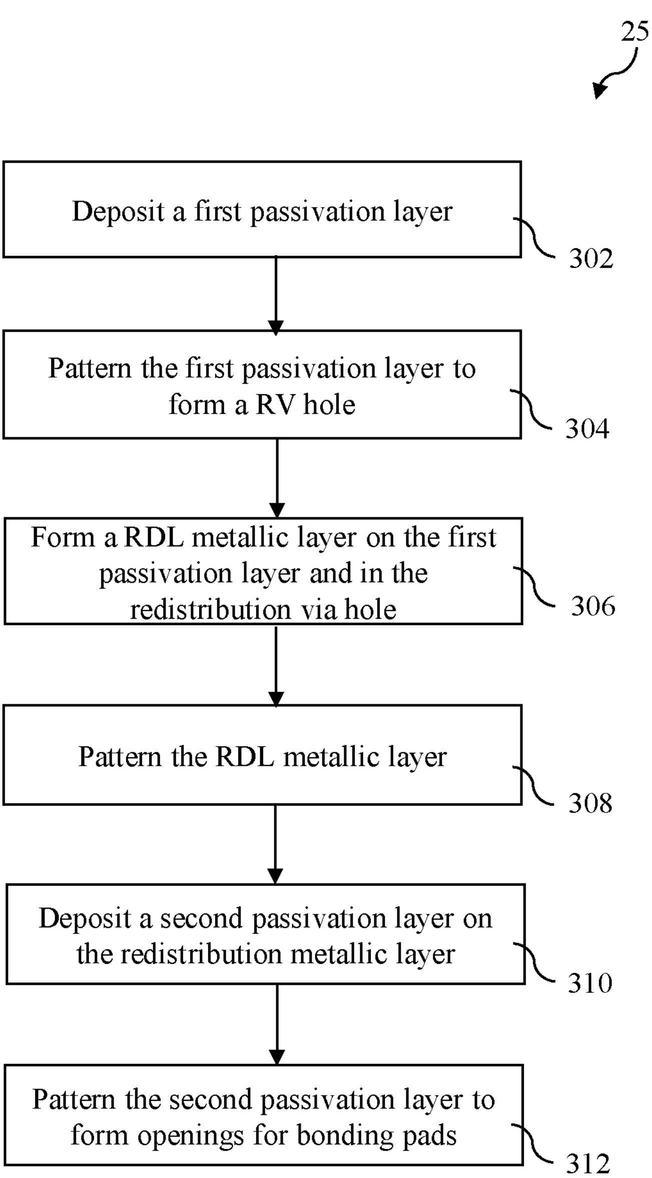
Figure 5C:
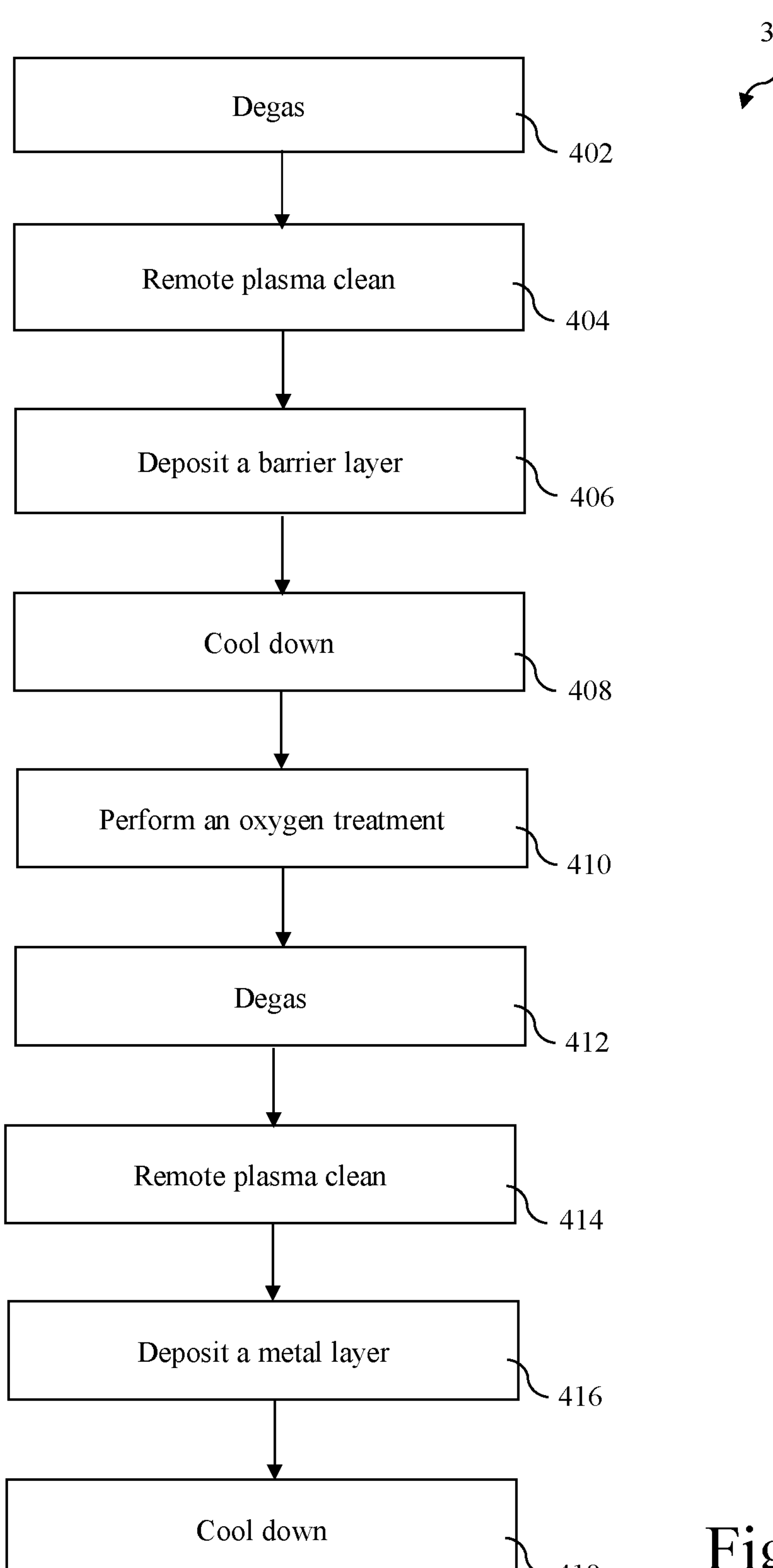

FIG. 5B is a flowchart of a method 258 to form the RDL structure 140 and FIG. 5C is a flowchart of a method 306 to form the RDL metallic features 142 according to some embodiments. FIGS. 6 through 15 are sectional views of the semiconductor structure 100 at various fabrication stages in accordance with some embodiments. The method 258 and the semiconductor structure 100 are collectively described with reference to FIGS. 6 through 15.

Figure 6:
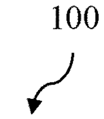
FIGS. 6, 7, 8, 9, 10 and 11 illustrate sectional views of an integrated circuit structure during various fabrication stages during the method of FIG. 4, constructed in accordance with some embodiments.
Figure 6:
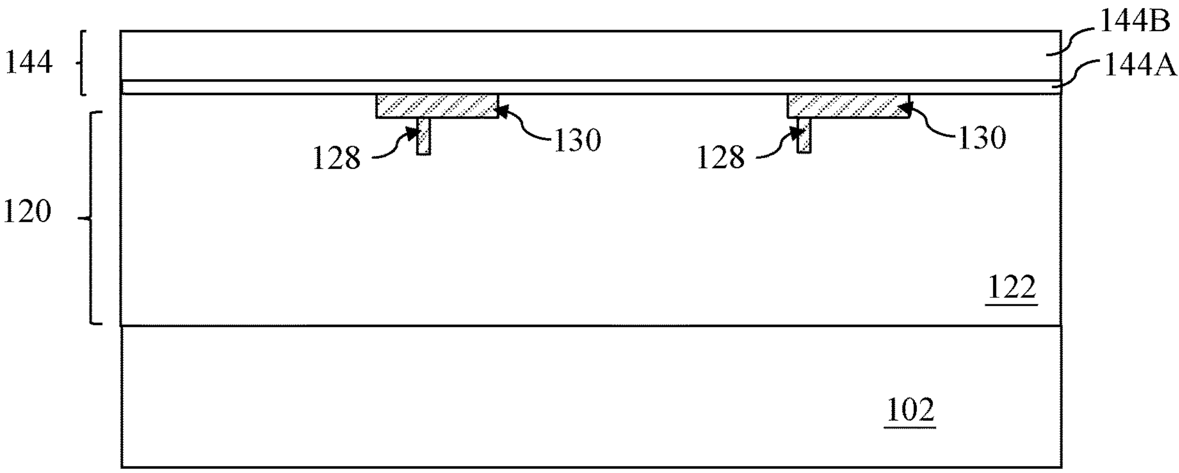

Referring to block 302 of FIG. 5B and FIG. 6, the method 258 includes an operation to deposit a first passivation layer 144 on the interconnect structure 120. FIG. 6 (other figures as well) skips some features (such as isolation features 104, IC devices, contacts 124, metal lines 126 and vias 128) on the substrate 102 and the interconnect structure 120 for simplicity. The first passivation layer 144 includes one or more dielectric material layers. In the present embodiment, the first passivation layer 144 includes a first dielectric material layer 144A and a second dielectric material layer 144B disposed on the first dielectric material layer 144A. In furtherance of the embodiment, the first dielectric material layer 144A includes silicon nitride (SiN) and has a thickness ranging between 500 angstrom and 1000 angstrom; and the second dielectric material layer 144B includes un-doped silica glass (USG) and has a thickness ranging between 5000 Angstrom and 10000 Angstrom. The first passivation layer 144 is deposited by a suitable deposition technology, such as CVD, high density plasma CVD (HDPCVD), other suitable technology or a combination thereof. The operation 302 may include multiple steps to deposit different dielectric material layers with respective precursors.

Figure 7:
Figure 7:
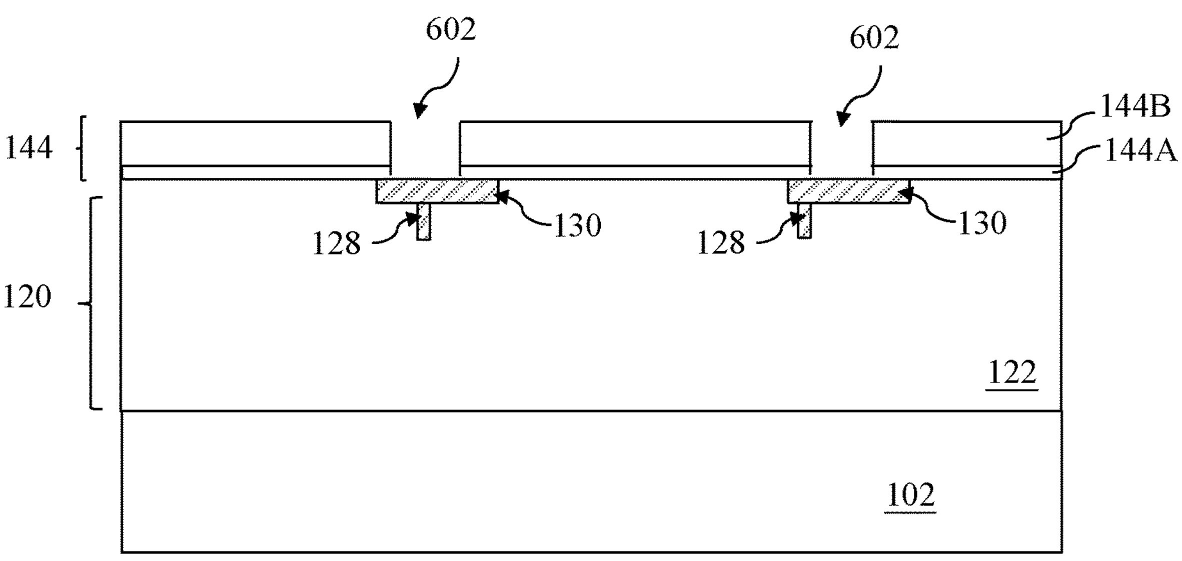

Referring to block 304 of FIG. 5B and FIG. 7, the method 258 includes an operation to pattern the first passivation layer 144 to form RV holes 602, which are aligned with respective top metal lines 130 so that the respective top metal lines 130 are exposed within the RV holes 602. In some embodiments, a RV hole 602 has a dimension ranging between 5 μm and 20 μm. The patterning process in the operation 304 includes lithography process and etching. In some examples, a patterned photoresist layer is formed by lithography process that further includes spin-on coating, exposure, developing, and one or more baking steps. An etching process is applied to the first passivation layer 144 through openings of the patterned photoresist (or resist) layer to form RV holes in the first passivation layer. The etching process may include dry etching, wet etching, or a combination thereof. The etching process may include multiple etching steps with different etchants to etch respective dielectric material layers. For example, the etching process may include a first etching process using buffered hydrofluoric acid to etch the USG layer 144B and phosphoric acid to etch the SiN layer 144A. In some examples, the operation 304 may uses a patterned hard mask to define the regions for RV holes. The formation of the patterned hard mask may include depositing a hard mask layer; forming a patterned resist layer by a lithography process; etching the hard mask through the openings of the patterned resist layer; and removing the patterned resist layer by wet stripping or plasma ashing.

Figure 8:
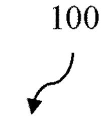
Figure 8:
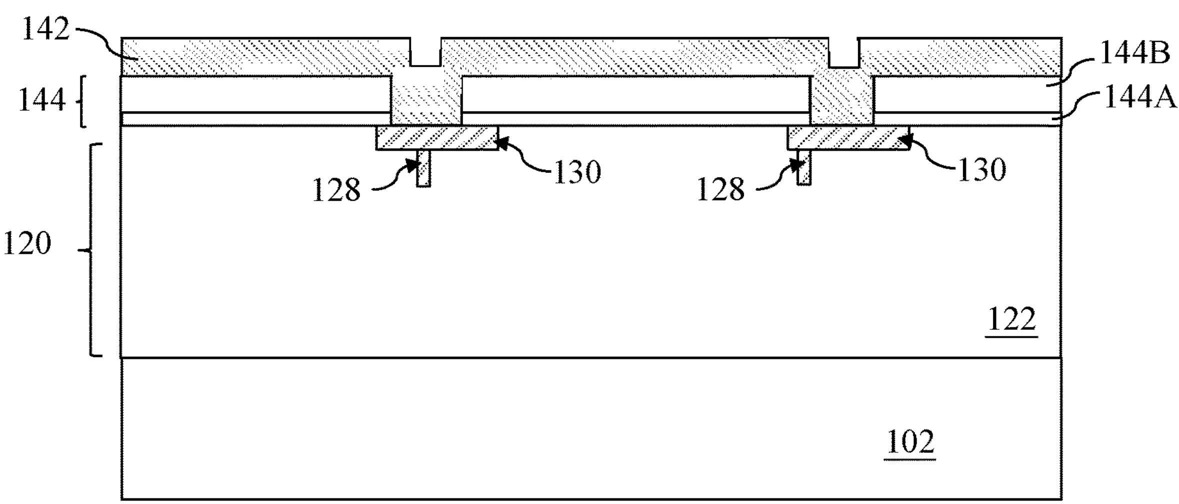

Referring to block 306 of FIG. 5B and FIG. 8, the method 258 includes an operation to form a RDL layer 142 on the first passivation layer 144 and on the top metal lines 130 within the RV holes 602. The RDL layer 142 directly contacts the top metal lines 130 through the RV holes. The RDL layer 142 includes multiple films formed by multiple steps. The structure and formation of the RDL layer 142 will be further described later in detail.

Figure 9:
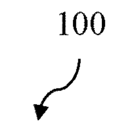
Figure 9:
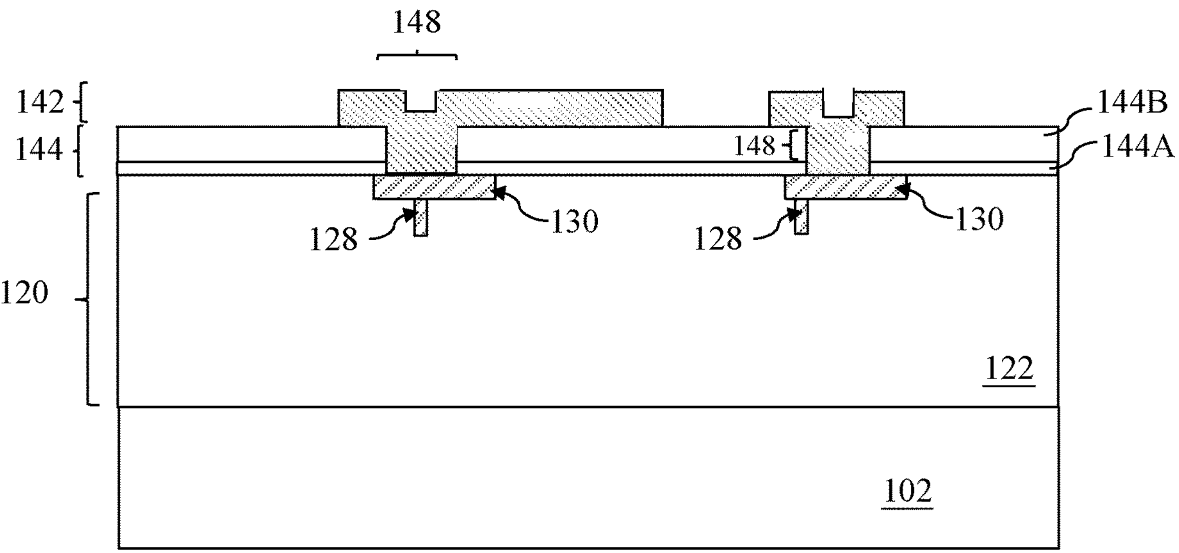

Referring to block 308 of FIG. 5B and FIG. 9, the method 258 proceeds to an operation by patterning the RDL layer 142 to form RDL metallic features (still labeled with numerical 142). The patterning process in the operation 308 includes lithography process and etching. Similarly, a patterned resist layer is formed by lithography process; and an etching process is applied to the RDL metallic layer to form RDL metallic features. The etching process may include dry etching, wet etching, or a combination thereof. The etching process may include multiple etching steps with different etchants to etch respective films in the RDL metallic layer. In some examples, the operation 308 may uses a patterned hard mask to define the regions for the portions of the RDL metallic layer to be removed.

After the completion of the operation 308, the RDL metallic features 142 are formed on the first passivation layer 144. Each RDL metallic feature 142 includes a portion 148 vertically extends to and directly contact the respective top metal line 130, the portion 148 being also referred to as RV 148.

Figure 10:
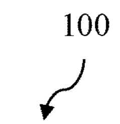
Figure 10:
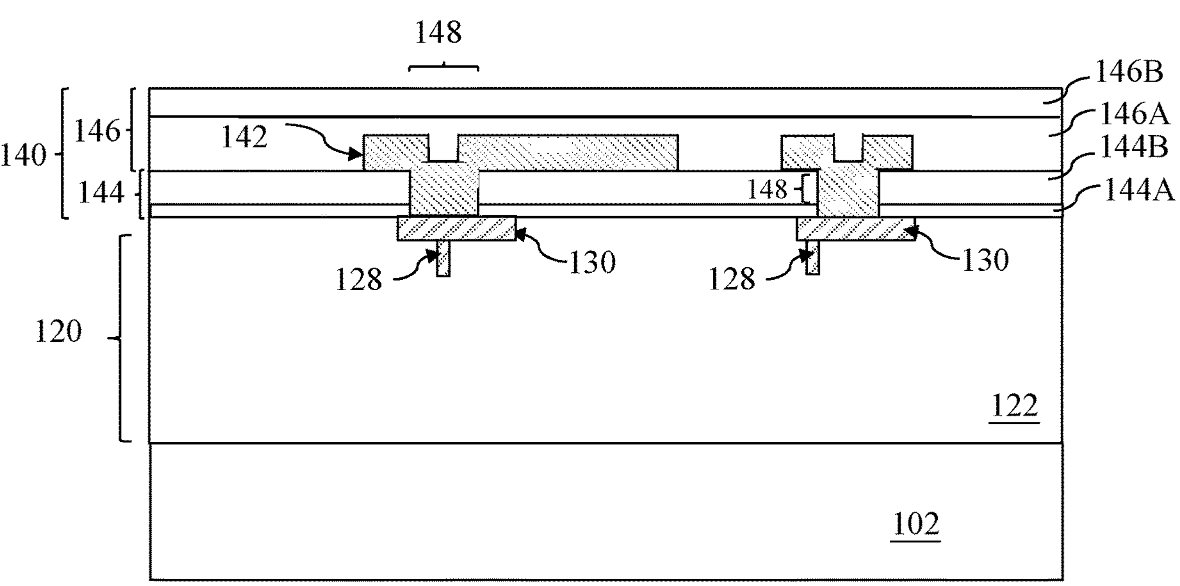

Referring to block 310 of FIG. 5B and FIG. 10, the method 258 includes an operation to deposit a second passivation layer 146 on the first passivation layer 144 and the RDL metallic features 142. The second passivation layer 146 includes one or more dielectric material layers. In the present embodiment, the second passivation layer 146 includes a first dielectric material layer 146A and a second dielectric material layer 146B disposed on the first dielectric material layer 146A. In furtherance of the embodiment, the first dielectric material layer 146A includes USG and has a thickness ranging between 2000 Angstrom and 4000 Angstrom; and the second dielectric material layer 146B includes SiN and has a thickness ranging between 2000 Angstrom and 6000 Angstrom. The second passivation layer 146 is deposited by a suitable deposition technology, such as HDPCVD, other suitable technology or a combination thereof. The operation 310 may include multiple steps to deposit different dielectric material layer with respective precursors.

Figure 11:
Figure 11:
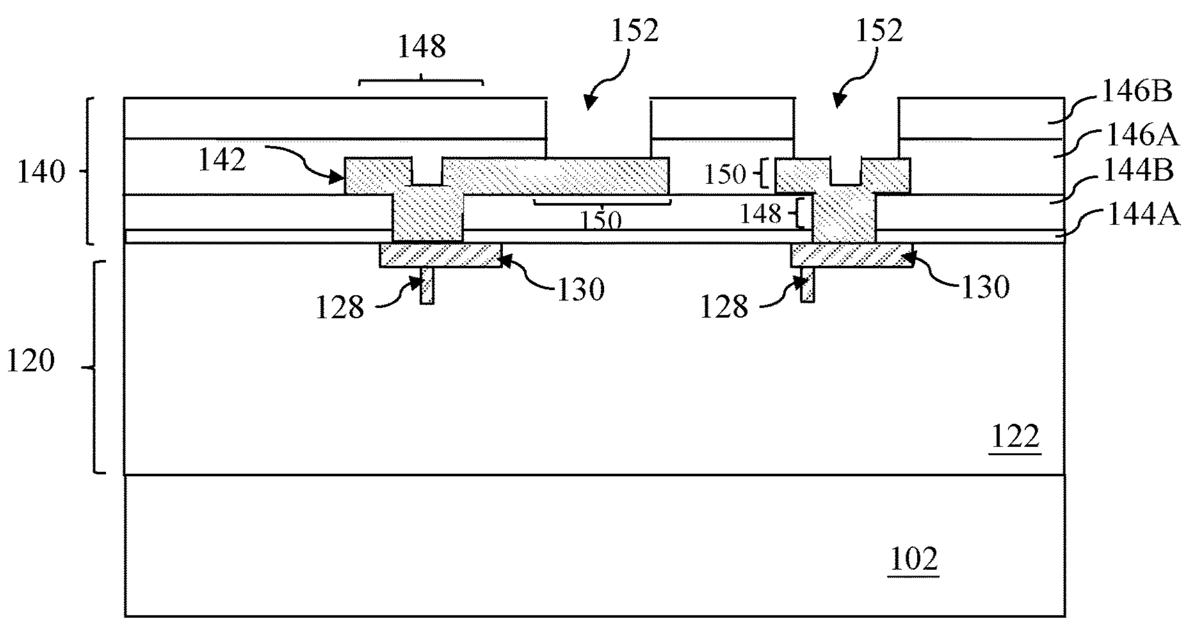

Referring to block 312 of FIG. 5B and FIG. 11, the method 258 includes an operation to pattern the second passivation layer 146 to form openings 152. A portion 150 of the RDL metallic feature 142 is exposed within the corresponding opening 152. The portion 150 functions as a bond pad. For example, solder ball may be further formed on the bond pad 150 and will be connected to the corresponding conductive feature in a circuit board during wafer scale chip bonding. In some embodiment, the opening 152 has a dimension ranging between 10 μm and 30 μm. A RDL metallic feature 142 vertically extends from the second passivation layer 146 to the first passivation layer 144 to directly contact the corresponding top metal line 130 within the RV hole and horizontally extends from the RV 148 to the bond pad 150 to redistribute the bonding locations, such as from the chip edge to the chip center.

The patterning process in the operation 312 includes lithography process and etching. In some examples, a patterned resist layer is formed by lithography process. An etching process is applied to the second passivation layer 146 through openings of the patterned resist layer to form openings 152 in the second passivation layer 146. The etching process may include dry etching, wet etching, or a combination thereof. The etching process may include multiple etching steps with different etchants to etch respective dielectric material layers. For example, the etching process may include a first etching process using buffered hydrofluoric acid to etch the USG layer 146A and phosphoric acid to etch the SiN layer 146B. In some examples, the operation 312 may uses a patterned hard mask to define the openings 152.

Figure 12:
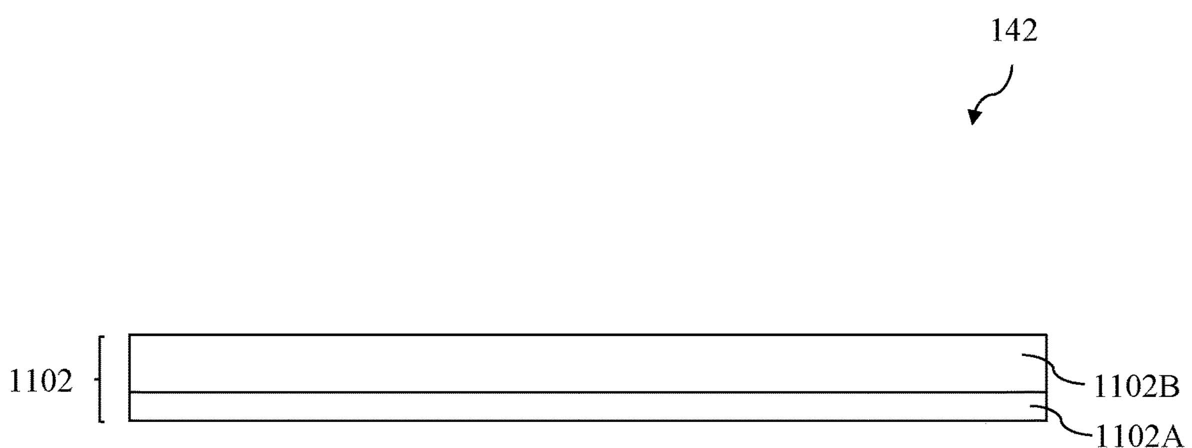
FIGS. 12, 13 and 14 illustrate sectional views of an RDL metallic layer during various fabrication stages, constructed in accordance with some embodiments.
Figure 13:
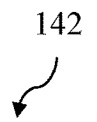
Figure 13:
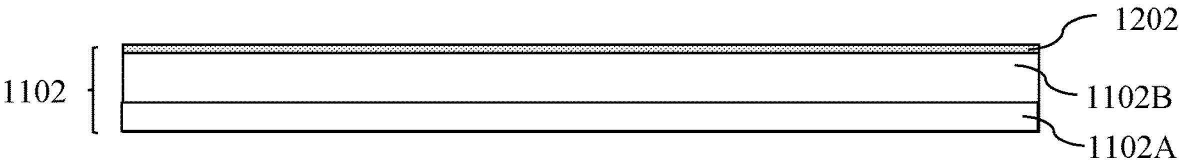
Figure 14:
Figure 14:
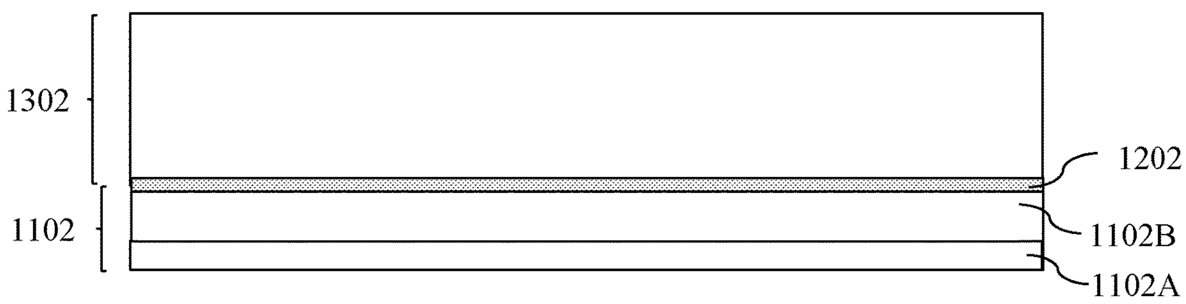

Now referring back to FIG. 5B, the operation 306 to form the RDL layer 142 is previously described and is now further described in detail with reference to FIGS. 5C and 12-14. FIG. 5C is a flowchart of a method 306 to form the RDL layer 142; and FIGS. 12 through 14 are sectional views of the RDL metallic layer at various fabrication stages in accordance with some embodiments. For simplicity, FIGS. 12-14 only illustrate various conductive films of the RDL layer 142.

Referring to block 402 of FIG. 5C, the method 306 includes an operation to perform a degas process to semiconductor structure 100. The degas process is performed in an inert gas environment (such as argon) at a high temperature to dehydrate the semiconductor structure 100. According to some examples, the degas process is performed at a temperature ranging between 200° C. and 400° C. with a degas duration ranging from 30 sec to 300 sec. In the present embodiment, the degas process is implemented in a PVD tool, such as a PVD cluster tool with plurality of processing chambers.

Referring to block 404 of FIG. 5C, the method 306 proceeds to an operation to perform a remote-plasma-cleaning (RPC) process to the semiconductor structure 100 to clean thereof, particularly the top metal lines 130. The RPC process removes particles, residuals and other contaminations from the top metal lines. The RPC process is performed in a gas environment in a plasma condition. In the present embodiment, the RPC process includes a gas of hydrogen and helium at the room temperature. According to some examples, hydrogen is between 3% and 10% (atomic percentage) and the helium is between 97% and 90% of the gas. In some examples, the gas pressure ranges between 10 millitorr (mTorr) and 30 mTorr. EF power to generate plasma ranges between 500 W and 1500 W. RPC treatment duration ranges between 30 sec and 300 sec. In the present embodiment, the RPC process is implemented in the same PVD tool.

Referring to block 406 of FIG. 5C and FIG. 12, the method 306 includes an operation to deposit a barrier layer 1102 on the first passivation layer 144 and the top metal lines 130 within the RV holes. The barrier layer 1102 may include tantalum (Ta), tantalum nitride (TaN), titanium (Ti), titanium nitride (TiN), other suitable material, or a combination thereof. In the present embodiment, the barrier layer 1102 includes a Ta film 1102A and a TaN film 1102B. In some examples, the Ta film 1102A has a thickness ranging between 5 Angstrom and 30 Angstrom; and the TaN film 1102B has a thickness ranges between 400 Angstrom and 800 Angstrom. In the present embodiment, the deposition of the barrier layer 1102 is also implemented in the same PVD tool. For example, in one deposition chamber, tantalum is deposited using a tantalum target and then then tantalum nitride is deposited with additional nitrogen gas in the same chamber or a different deposition chamber. In the present embodiment, the barrier layer 1102 has a polycrystalline structure.

Referring to block 408 of FIG. 5C, the method 306 proceeds to an operation to perform a cooling process to the semiconductor structure 100. For example, the cooling process is implemented in an inert gas (such as argon) environment for a suitable duration, such as a duration between 20 sec and 60 sec. The cooling process is also carried on in the same PVD tool.

Referring to block 410 of FIG. 5C and FIG. 13, the method 306 includes an operation to perform an oxygen treatment to the barrier layer 1102, thereby forming a diffusion layer 1202. The diffusion layer 1202 is a metallic oxide layer that includes oxygen and a metal. In the present embodiment, the diffusion layer 1202 includes oxygen and tantalum. In other embodiments, the diffusion layer 1202 further includes nitrogen. The diffusion layer 1202 may have a thickness ranging between 5 Angstrom and 30 Angstrom. The diffusion layer 1202 has a graded composition with a maximum oxygen concentration at the top surface of the diffusion layer 1202. In some examples, the maximum oxygen concentration is greater than 35% (atomic percentage) but less than 45%. In the present embodiment, the diffusion layer 1202 has an amorphous structure while the barrier layer 1102 has a polycrystalline structure.

During the oxygen treatment, oxygen diffuses into the barrier layer 1102. The oxygen treatment is also implemented in the same PVD tool. The oxygen treatment is in an oxygen environment at room temperature with oxygen flow rate ranging between 1 sccm and 20 sccm. In some embodiments, plasma may be applied to the oxygen gas with a low plasma power, such as in a range between 500 W and 1500 W, so that the oxygen concentration is controlled at a low level to maintain a suitable contact resistance.

Referring to block 412 of FIG. 5C, the method 306 includes an operation to perform a second degas process to semiconductor structure 100 after the formation of the barrier layer 1102 and the diffusion layer 1202. The second degas process is similar to the first degas process in the operation 402. For example, the second degas process is performed in an argon environment at a high temperature to dehydrate the semiconductor structure 100. According to some examples, the degas process is performed at a temperature ranging between 200° C. and 400° C. with a degas duration ranging from 30 sec to 300 sec. In the present embodiment, the degas process is implemented in the same PVD tool.

Referring to block 414 of FIG. 5C, the method 306 proceeds to an operation to perform a second RPC process to the semiconductor structure 100 to clean thereof, particularly to clean the barrier layer 1102 and the diffusion layer 1202. The second RPC process removes particles, residuals and other contaminations, such as from those metallic material layers. The second RPC process is similar to the first RPC process in the operation 404. For example, the second RPC process is performed in a gas environment in a plasma condition. In the present embodiment, the second RPC process includes a gas of hydrogen and helium at the room temperature. According to some examples, hydrogen is between 3% and 10% and the helium is between 97% and 90% of the gas. In some examples, the gas pressure ranges between 10 mTorr and 30 mTorr. EF power to generate plasma ranges between 500 W and 1500 W. The second RPC treatment duration ranges between 30 sec and 300 sec. In the present embodiment, the RPC process is implemented in the same PVD tool.

Referring to block 416 of FIG. 5C and FIG. 14, the method 306 includes an operation to deposit a metallic layer 1302 on the diffusion layer 1202. The metallic layer 1302 may include aluminum, copper, tungsten, other suitable metal or metal alloy, or a combination thereof. In the present embodiment, the metallic layer 1302 includes an aluminum copper (AlCu) alloy. In furtherance of the embodiment, the AlCu layer 1302 includes about 99.5% aluminum and about 0.5% copper. The AlCu layer 1302 is deposited by sputtering in the PVD tool at a high deposition temperature greater than 300° C., such as a temperature ranging between 300° C. and 500° C. In some examples, the deposition temperature ranges between 350° C. and 450° C. In the present embodiment, thus formed AlCu layer 1302 has a polycrystalline structure. Particularly, the grain size of the AlCu layer 1302 substantially distributed in a range between 5 μm and 20 μm. In some embodiments, the AlCu layer 1302 has a grain size distribution with more than 50% polycrystalline grains of grain sizes greater than 1 micron. In some embodiments, the AlCu layer 1302 has a thickness ranging between 6000 Angstrom and 12000 Angstrom.

In the existing method, an AlCu layer is deposited at a cold condition, such as a deposition temperature less than 300° C. Thus deposited AlCu layer cannot properly fill in gaps (such as RV holes), leaving a tooth-like profile. This further leads to incomplete or improper filling of the second passivation layer 146, causing various performance and reliability issues. By implementing a hot deposition in the disclosed method, the AlCu layer 1302 has improved gap filling on one side but may cause metal extrusion on another side. Especially, tantalum in the barrier layer 1102 diffusion to the AlCu layer 1302 and induces TaN lattice vacancy, which provides further chances for copper from the top metal line 130 to form copper extrusion. Furthermore, aluminum in the AlCu layer 1302 easily forms aluminum extrusion by thermal stress. By forming the diffusion layer 1202 that interposes between and separates the AlCu layer 1302 and the barrier layer 1102, various metal extrusions are effectively eliminated or substantially reduced. The disclosed method with hot deposition of the AlCu layer 1302 and oxygen treatment to form the diffusion layer 1202, both the filling issues and the metal extrusion issue are improved.

During the operation 416 to deposit the AlCu layer 1302, due to the high temperature deposition, aluminum from the AlCu layer 1302 may diffuse to the diffusion layer 1202. In this case, the diffusion layer 1202 also includes aluminum. In some embodiments, the diffusion layer 1202 includes tantalum, oxygen, aluminum and nitrogen.

Additionally, all above operations in the method 306 are implemented in various chambers of a cluster PVD. When the workpiece 100 is sent into the PVD tool through a load-lock and will be sent out after the completion of the above operations. Thus, the manufacturing cost is reduced and contamination among the operations is avoided. For example, the PVD cluster tool includes one or more degas chambers, one or more pre-clean chambers, one or more pass-through chambers, and a plurality of deposition chambers. In furtherance of the example, a degas operations is implemented in a degas chamber; an RPC operation is implemented in a pre-clean chamber; a cooling operation may be implemented in a pass-through chamber; various deposition operations (Ta, TaN and AlCu depositions) are implemented in various deposition chambers; and the oxygen treatment is implemented in a degas chamber, a pre-clean chamber, or a deposition chamber.

Figure 15:
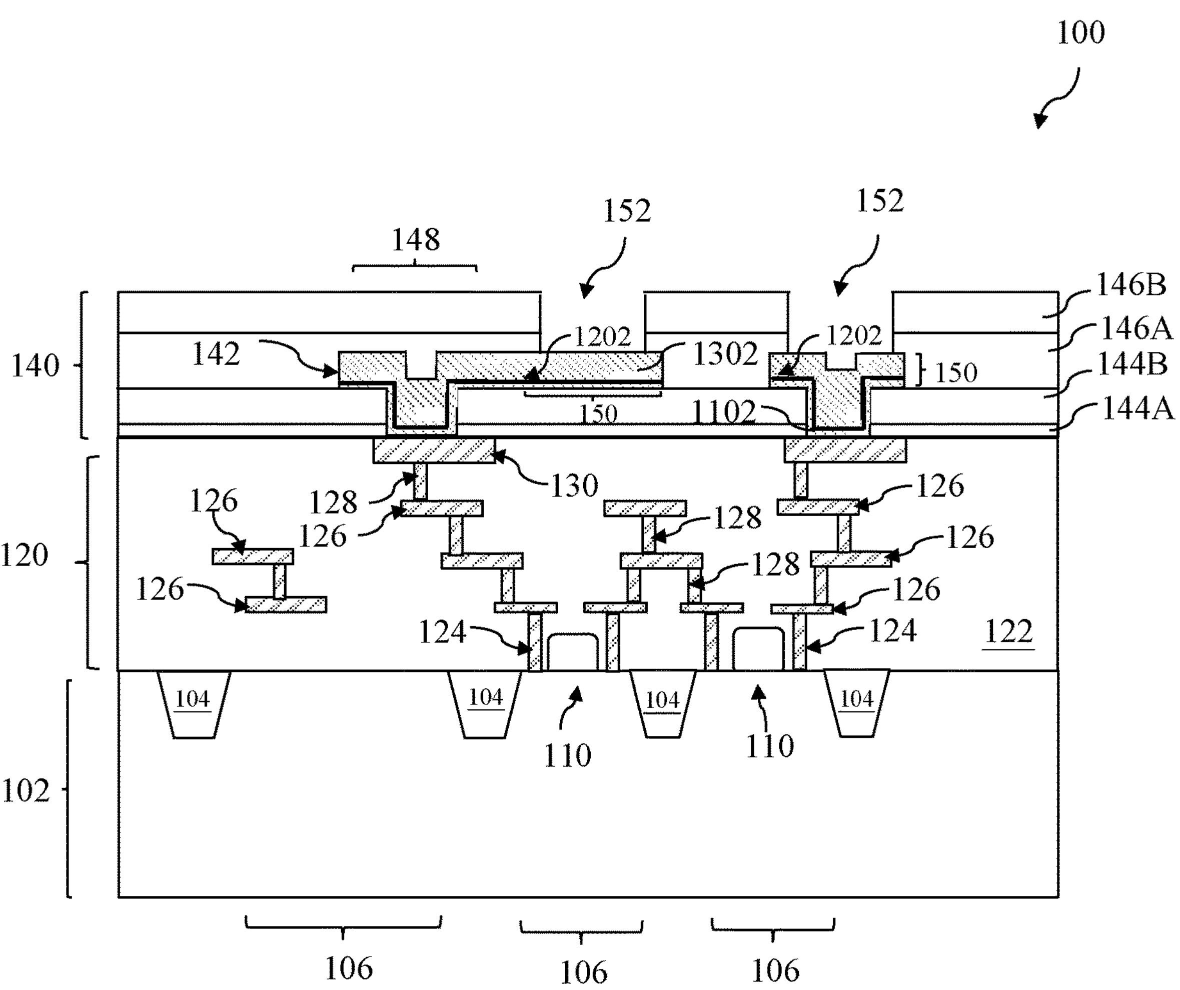
FIG. 15 illustrates a sectional view of an integrated circuit structure having a RDL structure, constructed in accordance with some embodiments.

Such formed semiconductor structure 100 by the method 200 is further illustrated in FIG. 15 in a sectional view, constructed in accordance with some embodiments. Particularly, the RDL structure 140 is formed by the method 200. More specifically, the RDL metallic features 142 are generated according to the modified RDL structure 140 and are formed by the method 222. The methods 220, 258 and 306 are portions of the method 200 but being detailed with multiple sub-operations.

The method 200 may additionally include other operations before, during or after the operations described above. The semiconductor structure may further include other features. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The present disclosure provides a semiconductor structure 100 and a method 200 making the same in various embodiments. The semiconductor structure 100 includes a RDL structure 140 having RDL metallic features 142 generated by the method 200 and are formed by the method 222. Particularly, the RDL structure 140 is modified to tune the layout of the RDL structure by dummy insertion and adjustment of the RDL metallic features. By implementing the disclosed method in various embodiments, some of advantages described below may present. However, it is understood that different embodiments disclosed herein offer different advantages and that no particular advantage is necessarily required in all embodiments. As one example, the deformation, such as warpage, of the semiconductor structure is reduced or eliminated.

In one example aspect, the present disclosure provides a method according to some embodiments. The method includes receiving an integrated circuit (IC) layout of a semiconductor structure that includes a redistribution layout (RDL) structure having a plurality of RDL metallic features; modifying the IC layout such that the RDL structure is modified to meet a criterion associated with a X-Y ratio gap; generating a tape-out according to the modified IC layout; and fabricating the semiconductor structure according to the modified IC layout defined in the tape-out.

In another example aspect, the present disclosure provides a method that includes receiving an integrated circuit (IC) layout of a semiconductor structure that includes a redistribution layout (RDL) structure having a plurality of RDL metallic features formed in a passivation layer over a semiconductor substrate, wherein the RDL metallic features include first conductive features longitudinally oriented along a first direction X and second conductive features longitudinally oriented along a second direction Y being orthogonal to the first direction X; determining criteria according to manufacturing data, wherein the criteria include a first criterion associated with a X-Y ratio gap and a second criterion associated with an average spacing of the RDL metallic features, wherein the X-Y ratio gap is defined as a difference between a first duty ratio of the first conductive features and a second duty ratio of the second conductive features; modifying the IC layout such that the modified RDL structure satisfies the first and second criteria; and generating a tape-out according to the modified IC layout.

In yet another example aspect, the present disclosure provides a semiconductor structure that further includes semiconductor devices formed on a semiconductor substrate; an interconnect structure disposed on the semiconductor devices; and a redistribution layout (RDL) structure disposed over the semiconductor substrate. The RDL structure includes a plurality of RDL metallic features embedded in a passivation layer. The RDL metallic features include first conductive features longitudinally oriented along a first direction X and second conductive features longitudinally oriented along a second direction Y being orthogonal to the first direction X. A X-Y ratio gap defined as a difference between a first duty ratio of the first conductive features and a second duty ratio of the second conductive features, and the X-Y ratio gap is less than 1.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method, comprising:

receiving an integrated circuit (IC) layout of a semiconductor structure that includes a redistribution layout (RDL) structure having a plurality of RDL metallic features, wherein the RDL metallic features include first conductive features longitudinally oriented along a first direction X and second conductive features longitudinally oriented along a second direction Y being orthogonal to the first direction X;

modifying the IC layout such that the modified RDL structure meets a criterion associated with a X-Y ratio gap, wherein the X-Y ratio gap is defined as a difference between a first duty ratio of the first conductive features and a second duty ratio of the second conductive features;

generating a tape-out according to the modified IC layout; and fabricating the semiconductor structure according to the modified IC layout defined in the tape-out.

2. The method of claim 1, wherein the RDL structure is formed in a passivation layer over a semiconductor substrate;

and the modifying the IC layout further includes:

determining the criterion associated with the X-Y ratio gap according to manufacturing data, wherein the criterion of the X-Y ratio gap is a value less than 1, evaluating the RDL structure according to the criterion, and adding dummy features to the RDL structure until the absolute value of the X-Y ratio gap is less than the value.

3. The method of claim 2, wherein the adding dummy features to the RDL structure includes adding the dummy features longitudinally oriented along Y direction to the RDL structure if the X-Y ratio gap is positive.

4. The method of claim 2, wherein the adding dummy features to the RDL structure includes adding the dummy features longitudinally oriented along X direction to the RDL structure if the X-Y ratio gap is negative.

5. The method of claim 2, wherein the criterion is 30% determined according to the manufacturing data.

6. The method of claim 2, wherein the criterion is a first criterion, wherein the modifying the IC layout further includes modifying the IC layout according to a second criterion, and wherein the second criterion is associated with an average spacing of the RDL metallic features of the RDL structure.

7. The method of claim 6, wherein the second criterion is associated with an average spacing of the RDL metallic features of the RDL structure, and wherein the evaluating the RDL structure further includes evaluating the RDL structure according to the second criterion.

8. The method of claim 7, wherein the modifying the IC layout further includes modifying the RDL structure such that the modified RDL structure meets the second criterion associated with the average spacing.

9. The method of claim 8, wherein the modifying the IC layout includes adjusting the RDL metallic features to meet the second criterion.

10. The method of claim 9, wherein the adjusting the RDL metallic features includes resizing the RDL metallic features.

11. The method of claim 9, wherein the second criterion is 3 μm; and the resizing the RDL metallic features includes increasing widths of the RDL metallic features.

12. The method of claim 1, wherein the fabricating the semiconductor structure according to the modified IC layout defined in the tape-out further includes making photomasks according to the modified IC layout defined in the tape-out; and making the semiconductor structure using the photomasks, wherein at least one of the photomasks defines the modified RDL structure that includes the RDL metallic features and dummy features.

13. A method, comprising:

receiving an integrated circuit (IC) layout of a semiconductor structure that includes a redistribution layout (RDL) structure having a plurality of RDL metallic features formed in a passivation layer over a semiconductor substrate, wherein the RDL metallic features include first conductive features longitudinally oriented along a first direction X and second conductive features longitudinally oriented along a second direction Y being orthogonal to the first direction X;

determining criteria according to manufacturing data, wherein the criteria include a first criterion associated with a X-Y ratio gap and a second criterion associated with an average spacing of the RDL metallic features, wherein the X-Y ratio gap is defined as a difference between a first duty ratio of the first conductive features and a second duty ratio of the second conductive features;

modifying the IC layout such that the modified RDL structure satisfies the first and second criteria; and generating a tape-out according to the modified IC layout.

14. The method of claim 13, further comprising:

making photomasks according to the modified IC layout defined in the tape-out; and fabricating the semiconductor structure using the photomasks, wherein at least one of the photomasks defines the modified RDL structure that includes the RDL metallic features and dummy features.

15. The method of claim 13, wherein the modifying the IC layout further includes adding the dummy features to the RDL structure and adjusting the RDL metallic features of the RDL structure.

16. The method of claim 13, wherein the determining of the first criterion includes determining the first criterion associated with the X-Y ratio gap, wherein the X-Y ratio gap is defined as a different between a first duty ratio of the first conductive features and a second duty ratio of the second conductive features, wherein the first criterion of the X-Y ratio gap is a value less than 1; and the modifying the IC layout further includes adding dummy features to the RDL structure until the absolute value of the X-Y ratio gap is less than the value.

17. The method of claim 16, wherein the adding dummy features to the RDL structure includes adding the dummy features longitudinally oriented along Y direction to the RDL structure if the X-Y ratio gap is positive.

18. The method of claim 16, wherein the adding dummy features to the RDL structure includes adding the dummy features longitudinally oriented along X direction to the RDL structure if the X-Y ratio gap is negative.

19. A method, comprising:

receiving an integrated circuit (IC) layout of a semiconductor structure that includes a redistribution layout (RDL) structure having a plurality of RDL metallic features formed in a passivation layer over a semiconductor substrate, wherein the RDL metallic features include first conductive features longitudinally oriented along a first direction X and second conductive features longitudinally oriented along a second direction Y being orthogonal to the first direction X;

determining criteria according to manufacturing data, wherein the criteria include a first criterion associated with a X-Y ratio gap and a second criterion associated with an average spacing of the RDL metallic features, wherein the X-Y ratio gap is defined as a difference between a first duty ratio of the first conductive features and a second duty ratio of the second conductive features;

modifying the IC layout such that the modified RDL structure satisfies the first and second criteria, wherein the modifying of the IC layout further includes adjusting RDL metallic features of the RDL structure and adding dummy features to the RDL structure;

making photomasks according to the modified IC layout; and fabricating the semiconductor structure using the photomasks.

20. The method of claim 19, wherein the determining of the first criterion includes determining the first criterion associated with the X-Y ratio gap, wherein the X-Y ratio gap is defined as a different between a first duty ratio of the first conductive features and a second duty ratio of the second conductive features, wherein the first criterion of the X-Y ratio gap is a value less than 1; and the modifying of the IC layout further includes adding dummy features longitudinally oriented along Y direction to the RDL structure until the absolute value of the modified X-Y ratio gap is less than the value when the X-Y ratio gap is positive.

* * * * *